(12) United States Patent
Bucur (10) Patent No.: US 8,294,424 B2
(45) Date of Patent: Oct. 23, 2012

(54) MONITORING BATTERY CELL VOLTAGE (75) Inventor: Constantin Bucur, Santa Clara, CA (US)

(73) Assignee: O2Micro International Limited, Grand Cayman (KY)

( * ) Notice: Subject to any disclaimer, the term of this patent is extended or adjusted under 35 U.S.C. 154(b) by 109 days.

(21) Appl. No.: 12/938,200

(22) Filed: Nov. 2, 2010

(65) Prior Publication Data
US 2011/0057586 A1 Mar. 10, 2011

Related U.S. Application Data (63) Continuation of application No. 11/457,932, filed on Jul. 17, 2006, now Pat. No. 7,825,627.

(51) Int. Cl.
*H02J 7/00* (2006.01)
*H02J 7/16* (2006.01)

(52) U.S. Cl. ........ 320/116; 320/118; 320/135; 320/137; 320/155

(58) Field of Classification Search ........... 320/116, 320/118, 135, 136, 138, 127, 125, 137, 164, 320/165, 162, 156, 157, 155
See application file for complete search history.

(56) References Cited

U.S. PATENT DOCUMENTS

| | | | |
|---|---|---|---|
| 4,590,430 A | 5/1986 | Vandenberghe et al. | |
| 5,625,275 A * | 4/1997 | Tanikawa et al. | 320/160 |
| 5,815,351 A * | 9/1998 | Ashok et al. | 361/18 |
| 5,939,801 A * | 8/1999 | Bouffard et al. | 307/65 |
| 6,060,864 A | 5/2000 | Ito et al. | |
| 6,081,095 A | 6/2000 | Tamura et al. | |
| 6,087,810 A | 7/2000 | Yoshida | |
| 6,091,227 A | 7/2000 | Beard | |
| 6,104,165 A | 8/2000 | Miyamoto et al. | |
| 6,107,782 A | 8/2000 | Imai et al. | |
| 6,130,813 A * | 10/2000 | Kates et al. | 361/93.1 |
| 6,160,377 A | 12/2000 | Fujii | |
| 6,181,106 B1 | 1/2001 | Finger | |
| 6,198,251 B1 | 3/2001 | Landon | |
| 6,208,117 B1 | 3/2001 | Hibi | |
| 6,225,789 B1 | 5/2001 | Yuen | |
| 6,281,661 B2 | 8/2001 | Kaite et al. | |

(Continued)

FOREIGN PATENT DOCUMENTS
CN 2424487 3/2001
(Continued)

OTHER PUBLICATIONS

European Office Action dated Sep. 10, 2007, received in related EPO application No. 07011030.9-1236, (7 pgs).

(Continued)

*Primary Examiner* — Edward Tso
*Assistant Examiner* — Alexis Boateng
(74) *Attorney, Agent, or Firm* — SNR Denton US LLP

(57) ABSTRACT

An apparatus includes battery gauge circuitry implemented on an integrated circuit. The battery gauge circuitry includes a plurality of switches that individually open in response to a voltage reduction on a battery cell associated with a respective one of the switches. The battery gauge circuitry also includes a logic device that determines if at least one of the switches is open. The battery gauge circuitry also includes a register that stores data that indicates if at least one switch is open. The battery gauge circuitry also includes a controller that initiates halting power delivery to a load if at least one of the switches is open. The controller also identifies the open switch.

20 Claims, 4 Drawing Sheets

U.S. PATENT DOCUMENTS

| | | |
|---|---|---|
| 6,339,314 B1 | 1/2002 | Bruning |
| 6,346,794 B1 | 2/2002 | Odaohhara |
| 6,411,483 B1 * | 6/2002 | Sarles et al. ............. 361/93.4 |
| 6,522,102 B1 | 2/2003 | Cheiky et al. |
| 6,762,588 B2 | 7/2004 | Miyazaki et al. |
| 7,138,775 B2 | 11/2006 | Sugimoto et al. |
| 7,262,605 B2 | 8/2007 | Seo et al. |
| 2001/0017534 A1 | 8/2001 | Haraguchi et al. |
| 2003/0015995 A1 | 1/2003 | Tamura et al. |
| 2003/0030413 A1 | 2/2003 | Saeki et al. |
| 2005/0077878 A1 | 4/2005 | Carrier et al. |
| 2005/0127873 A1 | 6/2005 | Yamamoto et al. |
| 2005/0212486 A1 | 9/2005 | Nakada et al. |
| 2007/0195564 A1 | 8/2007 | Arbesman et al. |

FOREIGN PATENT DOCUMENTS

| | | |
|---|---|---|
| CN | 1406406 | 3/2003 |
| EP | 1788687 A1 | 5/2007 |
| JP | S58-97720 A | 6/1983 |
| JP | 2001174531 | 6/2001 |
| JP | 2001-245437 A | 9/2001 |
| JP | 2002-058170 A | 2/2002 |
| JP | 2005-278248 A | 10/2005 |
| JP | 2006-115640 | 4/2006 |
| WO | 2005117232 A2 | 12/2005 |

OTHER PUBLICATIONS

European communication pursuant to Article 94(3) EPC dated Jun. 16, 2008 issued in related European Patent Application No. 07011030.9-1236 (1 page).

Chinese Office Action dated Oct. 16, 2009 issued in related Chinese Patent Application No. 2007101452129.

Chinese Office Action dated Jun. 8, 2010 issued in related Chinese Patent Application No. 2007101452129.

Chinese Office Action dated Jun. 23, 2011 issued in related Chinese Patent Application No. 2007101452129.

Japanese Patent Office Action dated Aug. 14, 2012 corresponding to Japanese Serial No. 2007-135907.

* cited by examiner

MONITORING BATTERY CELL VOLTAGE

CROSS-REFERENCE TO RELATED APPLICATIONS

This application is a continuation application under 37 CFR §1.53(b) of U.S. application Ser. No. 11/457,932 filed Jul. 17, 2006, now U.S. Pat. No. 7,825,627, the entire disclosures of which are incorporated herein by reference.

TECHNICAL FIELD

This disclosure relates to monitoring battery cells and, more particularly, to monitoring voltage discharge on battery cells.

BACKGROUND

Some electrical devices such as power tools, electrical vehicles and other portable devices may be powered by battery packs. By attaching a cordless battery pack to a power tool, a user is free to move about without being constrained by a power cord.

A battery pack may include battery cells and switching circuitry for allowing the battery cells to supply power or be charged. One or more monitoring functions may be performed by circuitry included in the battery pack to maintain a safe use of the battery cells. For example, the voltage levels present on each battery cell may be monitored.

Certain battery cell chemistries e.g., lithium-ion cells, may become hazardous if their voltage level exceeds a high voltage threshold or drops below a low voltage threshold. Accordingly, conventional circuitries may monitor battery cell voltage and compare the monitored voltage to predefined low and high voltage thresholds. If either threshold is reached, a safety function (e.g., increase monitoring rate, open a switch, etc.) may be initiated. However, determining that a threshold breech may take a considerable period of time, and such a long period of time may exceed safety limits of the battery.

SUMMARY OF THE DISCLOSURE

In accordance with an aspect of the disclosure, an apparatus includes battery gauge circuitry implemented on an integrated circuit. The battery gauge circuitry includes a plurality of switches that individually open in response to a voltage reduction on a battery cell associated with a respective one of the switches. The battery gauge circuitry also includes a logic device that determines if at least one of the switches is open. The battery gauge circuitry also includes a register that stores data that indicates if at least one switch is open. The battery gauge circuitry also includes a controller that initiates halting power delivery to a load if at least one of the switches is open. The controller also identifies the open switch. In one embodiment, the battery gauge circuitry provided herein may work in conjunction with a microcontroller included with a battery pack.

In accordance with another aspect of the disclosure, a battery pack includes a plurality of battery cells and discharge switch circuitry that provides power from the battery cells to a load. The battery pack also includes battery gauge circuitry implemented on an integrated circuit. The battery gauge circuitry includes a plurality of switches that individually open in response to a voltage reduction on one of the battery cells associated with a respective one of the switches. The battery gauge circuitry also includes a logic device configured to determine if at least one of the switches is open. The battery gauge circuitry also includes a register that stores data that indicates if at least one switch is open. The battery gauge circuitry also includes a controller that initiates opening of the discharge switch circuitry if at least one of the switches is open. The controller also identifies the open switch.

In accordance with another aspect of the disclosure, a method includes opening one of a plurality of switches in response to a voltage reduction on a battery cell associated with the switch being opened. The method also includes determining with a logic device if at least one of the switches is open. The method also includes storing data in a register that indicates if at least one switch is open. The method also includes opening discharge switch circuitry if at least one of the switches is open. The method also includes identifying the open switch.

In accordance with another aspect of the disclosure, an article includes a storage medium storing instructions that when executed by a machine result in the following operations. One operation includes opening one of a plurality of switches in response to a voltage reduction on a battery cell associated with the switch being opened. Another operation includes determining with a logic device if at least one of the switches is open. Another operation includes storing data in a register that indicates if at least one switch is open. Another operation includes opening discharge switch circuitry if at least one of the switches is open. Another operation includes identifying the open switch.

Additional advantages and aspects of the present disclosure will become readily apparent to those skilled in the art from the following detailed description, wherein embodiments of the present invention are shown and described, simply by way of illustration of the best mode contemplated for practicing the present invention. As will be described, the present disclosure is capable of other and different embodiments, and its several details are susceptible of modification in various obvious respects, all without departing from the spirit of the present disclosure. Accordingly, the drawings and description are to be regarded as illustrative in nature, and not as limitative.

BRIEF DESCRIPTION OF THE DRAWINGS

Features and advantages of the claimed subject matter are set forth by the description of exemplary embodiments consistent therewith, which description should be understood in conjunction with accompanying drawings, wherein:

DETAILED DESCRIPTION OF THE EMBODIMENTS

Figure 1:
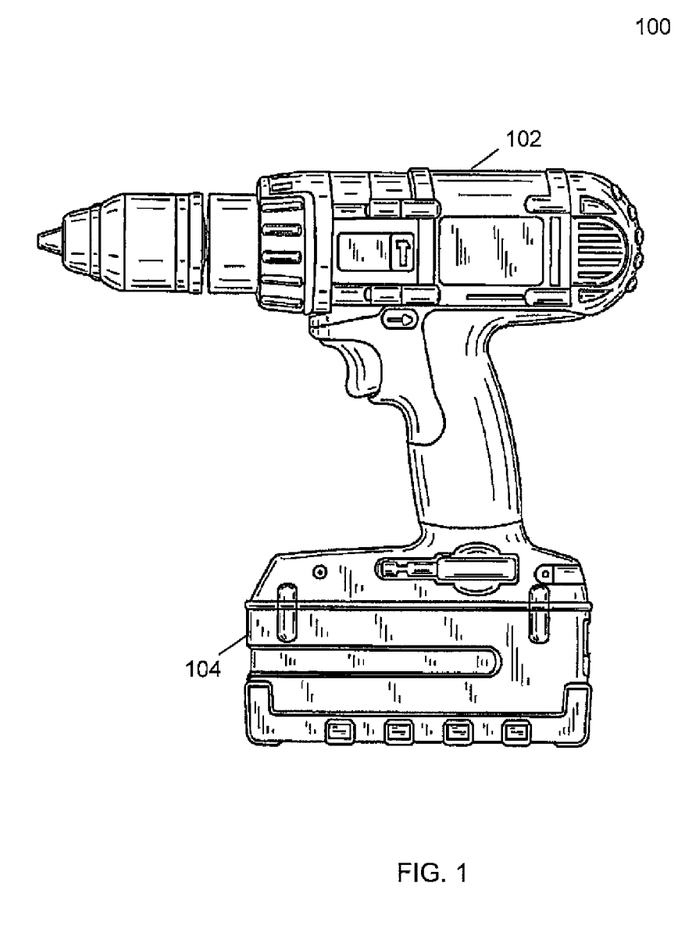
FIG. 1 is a diagrammatic view of a power tool that includes a battery pack.

Referring to FIG. 1, an exemplary cordless power tool 100 may include a drill 102 and a battery pack 104. Drill 102 may be fitted with one or more drill bits, screwdriver heads, etc., for performing a variety of operations (e.g., drilling a hole, inserting and/or removing a screw, etc.). While this exemplary power tool includes a drill, other embodiments may include other types of electrical tools and/or devices (e.g., vacuum cleaners, circular saw, drill, flood light, laser guide/level, etc.).

Typically, battery pack 104 may include a power source (e.g., battery cells) for supplying power to drill 102. By providing a cordless power source, a user may freely roam and use cordless power tool 100 without being constrained by a power cord connected to a wall socket. Along with providing power, during some periods battery pack 104 may share data with a computing device (not shown) via digital or analog data bus e.g., a wireless link (not shown), a parallel cable (not shown), a universal serial bus cable (not shown), and/or a network cable. Shared data may include status data (e.g., power source charge level, drill operating or idle, etc.), identification data (e.g., drill manufacturer, battery cell type included in battery pack, etc.), and/or other type information.

Figure 2:
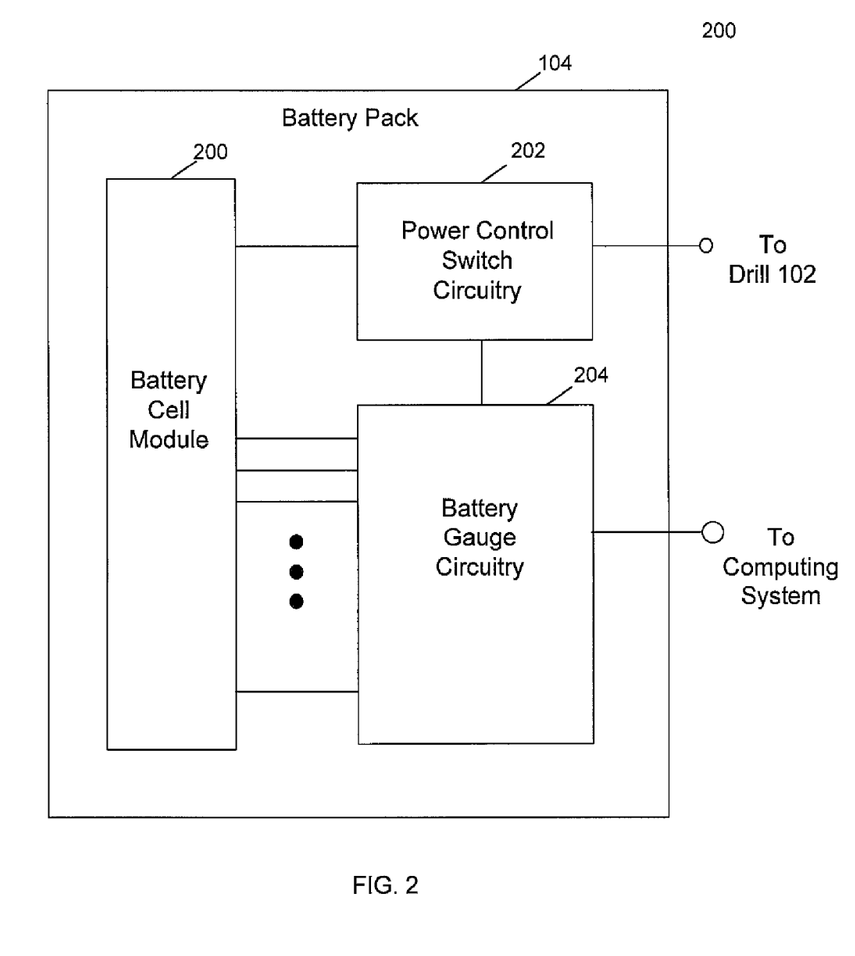
FIG. 2 is a block diagram that represents portions of the battery pack shown in FIG. 1.

Referring to FIG. 2, a block diagram of battery pack 104 is shown. Battery pack 104 may include a battery cell module 200, power control switch circuitry 202 and battery gauge circuitry 204. Battery cell module 200 may include a group of battery cells or other type of energy storage device (e.g., fuel cells, etc.) that may provide power to one or more loads (e.g., a motor) included in drill 102. To control the power being delivered to drill 102, battery cell module 200 may be connected to power control switch circuitry 202. For example, if the power being provided drops below a predefined threshold, power control switch circuitry 202 may open the connection between battery cell module 200 and the motor of drill 102. Alternatively, if an appropriate amount power may be provided by battery cell module 200, power control switch circuitry 202 may allow power delivery by closing the connection between the battery cell module and the motor of drill 102.

Battery gauge circuitry 204 may control power control switch circuitry 202 in regards to connecting or disconnecting battery cell module 200 and the motor of drill 102. To provide this control, battery gauge circuitry 204 may monitor battery cell module 200. For example, battery gauge circuitry 204 may monitor voltage present on one or more battery cells that may be included in battery cell module 200. If the voltage present on one or more battery cells drops below (or rises above) a predefined level, battery gauge circuitry 204 may trigger power control switch circuitry 202 to open the connection between battery cell module 200 and the motor or drill 102. Alternatively, if the voltage present on the battery cells is within a safe operating range, battery gauge circuitry 204 may cause power control switch circuitry 202 to close the connection between battery cell module 200 and the motor of drill 102.

Along with controlling the operation of power control switch circuitry 202, battery gauge circuitry 204 may transmit and/or receive information from a computing system (not shown) that may be connected to battery pack 104. For example, battery gauge circuitry 204 may transmit data that may represent the voltage level present on one or more of the battery cells included in battery cell module 200. Data may also be provided to the computing system that identifies the individual battery cell (or battery cells) that are not operating within the predefined safe range. Data transmission may be scheduled, for example, on a periodic basis and/or based on the occurrence of particular events. For example, data that represents the voltage present on each battery cell may be transmitted at one or more times each second. In regards to transmissions triggered by one or more events, the voltage data may be transmitted whenever the motor of drill 102 may idle and may not be drawing power from battery pack 104. Battery gauge circuitry 204 may also implement one or more data transmission schemes (e.g., compression, encoding, encryption, etc.) and/or reception schemes (e.g., decompression, decoding, decryption, etc.) to share information with the one or more connected computing systems.

Figure 3:
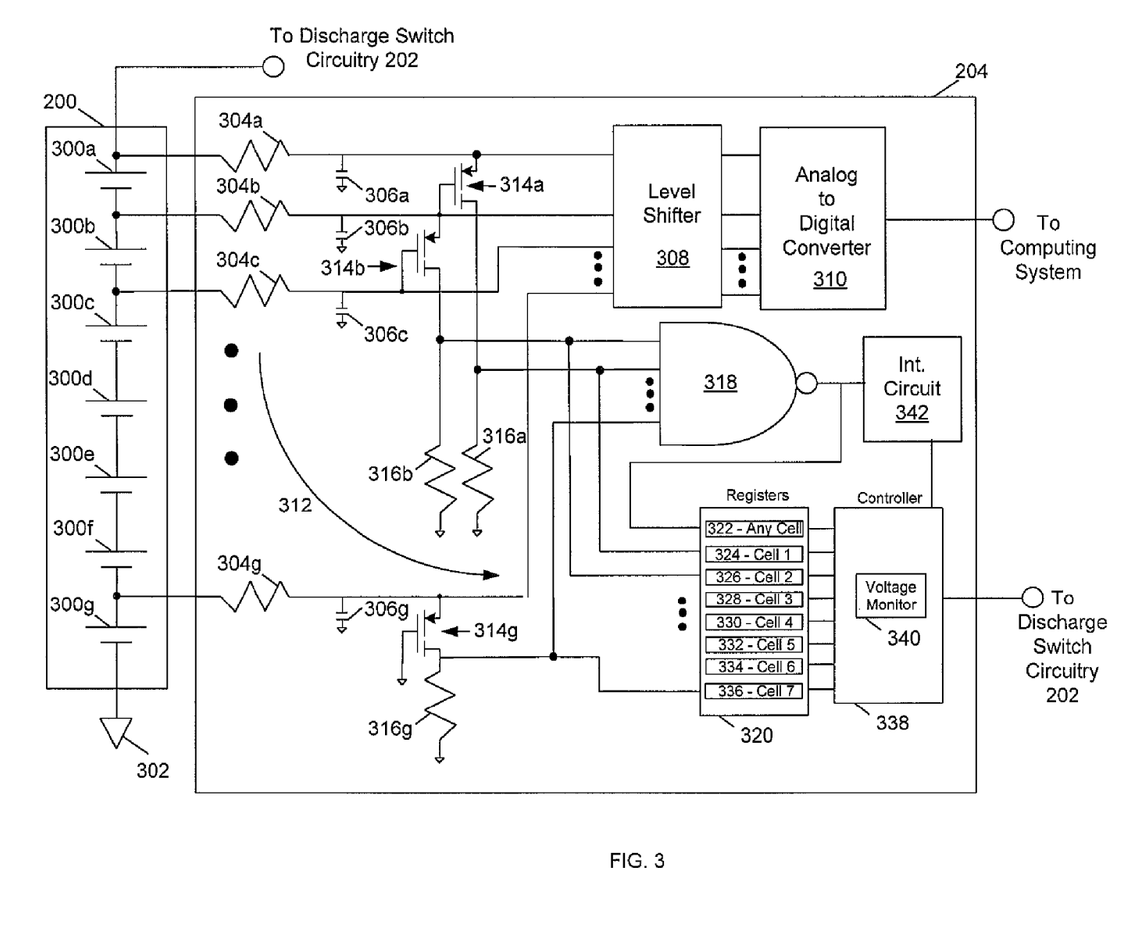
FIG. 3 is a block diagram that represents an exemplary battery gauge that relatively quickly monitors the voltage levels present on the battery cells shown in FIG. 2.

Referring to FIG. 3, a block diagram of battery cell module 200 and battery gauge circuitry 204 is shown. Battery cell module 200 may include one or more battery cells or other type of energy storage devices (e.g., fuel cell, etc.) that may be used to power the motor of drill 102. In this embodiment, battery cell module 200 may include seven battery cells 300a, 300b, 300c, 300d, 300e, 300f and 300g, however, more or less battery cells may be implemented. Battery cells may be connected in series such that the voltage provided by battery cell module 200 may be substantially equivalent to the sum of the voltages present on each of battery cells 300a-g. To provide this summed voltage, battery cell 300a may be connected to power control switch circuitry 202 (that may provide the voltage to the motor of drill 102). In this embodiment battery cell 300g may be connected to a ground terminal 302.

To monitor the voltage present on each battery cell 300a-g, one side of each battery cell may be connected to battery gauge circuitry 204. In this embodiment the positive terminal of each battery cell 300a-g may be connected to battery gauge circuitry 204. Each positive terminal may be connected to an individual low pass filter that includes a resistor and capacitor. For example, batter cell 300a may be connected to a low pass filter that includes a resistor 304a and a capacitor 306a. Similarly, battery cells 300b-g may be connected to low pass filters that respectively include resistors 304b-g and capacitors 306b-g.

Once filtered by the respective low pass filters that may include resistors 304a-g and capacitors 306a-g, the voltage present on battery cells 300a-g may be provided to a level shifter 308. Level shifter 308 may condition (e.g., raise the voltage level, lower the voltage level, filter, etc.) each voltage signal in preparation for being converted from the analog domain into the digital domain. In this embodiment, level shifter 308 provides the conditioned voltage signals to an analog to digital converter (ADC) 310 that may convert each analog voltage signal into a digital signal (e.g., an 8-bit binary number, a 12-bit binary number, etc.). ADC 310 may implement one or more conversion techniques (e.g., flash converter, successive approximation converter, sigma-delta converter, etc.). Additionally, while a single ADC 310 may be included in battery gauge circuitry 204, in some embodiments, more than one ADC's may be implemented.

ADC converter 310 may provide one or more digital signals (that represent the voltage present at each battery cell 300a-g) to a computing system (not shown). This computing system may be incorporated into cordless power tool 100 and/or be located remote (via a wireless link or other type of connection) from the cordless power tool. By providing this voltage level representation to the computing system, a voltage reduction on one or more of battery cells 300a-g may be detected. Once detected, one or more control signals may be sent to discharge switch circuitry 202 to halt delivery of power from battery module 200 to the motor of power drill 102. Additionally, by providing the voltage level of each battery cell 300a-g, the computer system may identify which one (or more) of the battery cells have a reduced voltage level. Once identified, the deficient battery cell or cells may be recharged to replenish their voltages to an appropriate level. Along with sensing a reduced voltage level (on one or more battery cells), other events may be monitored. For example, voltage levels that exceed a predefined threshold may be detected and/or other types of events (e.g., temperature within battery module 200 exceeding a threshold, etc.).

Typically, ADC 310 may generate one or more digital signals that represent the voltage present on each battery cell 300a-g. These battery cell voltages may be sampled by ADC 310 in a repetitive manner over a period of time. For each sample period, ADC 310 may generate and provide one or more digital signals to the computing system. Thereby, the voltage present on each battery cell may be monitored over a period of time. Such repetitive converting by ADC 310 may consume a considerable amount of power. Additionally, by repetitively generating one or more digital signals over a period of time, substantial processing time and resources may be needed from battery gauge circuitry 204 and the computing system. Furthermore, the time needed for processing these signals may delay detecting a voltage reduction on one or more battery cells and/or identifying the deficient battery cell (or cells).

Detection time for determining if voltage may have been reduced on one or more of battery cells 302a-g may be decreased by including a dedicated processing path 312 in battery gauge circuitry 204. Processing path 312 may also reduce the processing time to identify the one or more battery cells 300a-g that may have a reduced voltage level. By incorporating components such as combination logic devices in processing path 312, power consumption and processing time may be substantially reduced compared to using ADC 310. For example, ADC 310 may need milli-seconds of processing time (e.g., seven milli-seconds) for converting and transferring the digital data to the computer system. In comparison, processing path 312 may need a few micro-second clock cycles (e.g., 2 clock cycles (2 micro-seconds)) to determine if one or more of battery cells 300a-g has experienced a voltage reduction.

To provide this functionality, processing path 312 may include additional circuitry and/or components. For example, switches 314a, 314b, 314c (not shown), 314d (not shown), 314e (not shown), 314f (not shown) and 314g may be included in battery gauge circuitry 204. Resistors 316a, 316b, 316c (not shown), 316d (not shown), 316e (not shown), 316f (not shown) and 316g may also be included in battery gauge circuitry 204. One or more combinational logic components such as a NAND gate 318 may be included in processing path 312. For storing data that represents the status of the voltage present at each battery cell 300a-g, a group of registers 320 may be included in path 312. In this embodiment, register group 320 includes eight registers 322, 324, 326, 328, 330, 332, 334 and 336. To access one or more of the registers 322-336, a controller 338 may be included in processing path 312. Along with determining if one or more of battery cells 300a-g may have experienced a voltage reduction, controller 322 may identify the one more cells that may have experienced a voltage reduction.

Switches 314a-g may respectively connect between capacitors 306a-g and level shifter 308. In this embodiment, each of switches 314a-g may be implemented as N-channel metal oxide semiconductor field effect transistors (MOSFETs). However, in some embodiments other types of field effect transistors (e.g., p-channel MOSFETs) and/or other types of transistors (e.g., bipolar junction transistors) may be used to implement one or more of switches 314a-g. The voltages present on battery cells 300a-g may substantially bias the respective switches 314a-g. For example, a signal that represents the voltage present at battery cell 300a may be provided (via resistor 304a and capacitor 306a) to switch 314a. If the voltage may be substantially equivalent to or above a predefined threshold, switch 314a may be biased to close. If biased closed, a signal that represents the voltage present on battery 300a may be provided to a resistor 316a (via switch 314a). Based on the received signal from switch 314a, a voltage may be present across resistor 316a. For example, if an appropriate voltage is present at battery cell 300a, switch 314a may be biased closed and a voltage representative of the voltage at battery cell 300a may be present across resistor 316a.

Alternatively, the voltage present on battery cell 300a may not bias switch 314a to close. For example, the voltage present at battery cell 300a may be below a predefined threshold needed to bias switch 314a. Due to power delivery, this voltage reduction may be experienced by battery 300a. Since switch 314a may not be biased to close, a relatively small amount of current may flow to resistor 316a. Thereby, a relatively low voltage may be present across resistor 316a. This low voltage may be detected by controller 338. Furthermore, based on this low voltage, controller 338 may identify battery cell 300a as being under-voltage and initiate an appropriate response (e.g., disconnect the load and/or recharge battery cell 300a). Similar to resistor 316a, resistors 316b-g may be used by controller 338 for detecting if one or more of battery cells 316b-g may have experienced a voltage reduction. Additionally, the voltages present across resistors 316b-g may assist controller 338 in identifying the one or more battery cells that have experienced a low voltage fault condition. To that end, interrupt circuitry 342 may generate an interrupt to controller 338 indicative of a fault condition. The interrupt generated by interrupt circuitry 342 may cause controller 338 to enter a protection mode to disable battery discharging to protect cells in an under-voltage condition. The output of NAND gate 318 may be used to trigger an interrupt (via interrupt circuitry 442) to controller 338 if, for example, the output of the NAND gate 318 is a logic "1". This may cause controller 338 to read from the registers 320 in a manner described herein.

To detect if the one or more of the voltages present battery cells 300a-g may have reduced, each of resistors 316a-g may be connected to an input of NAND gate 318. For this embodiment NAND gate 318 may include seven inputs (e.g., one for each resistor 316a-g). Based on the logical functionality of NAND gate 318, a logic "0" may be output if a logic "1" is present on each input to the gate. Accordingly, if any input to NAND gate 318 may be logic "0", the output of the gate may be logic "1". So, if one or more of switches 314a-314g may not be biased closed, a voltage present on the respective one or more of resistors 316a-g may be relatively low. Accordingly, this relatively low voltage may be considered a logic "0" being input to NAND gate 318. Thereby, if one or inputs of NAND gate 318 are provided logic "0", logic "1" may be output by gate. So, if a voltage reduction may be experienced at one or more of battery cells 300a-g, logic "1" may be output from NAND gate 318. This logic "1" may be used by controller 338 to detect a voltage reduction at one or more of battery cells 300a-g. In this embodiment NAND gate 318 provides the logical operations for detecting a voltage reduction. However, in some embodiments other types of combination logic (e.g., AND gates, OR gates, Exclusive OR gates, NOR gates, etc.) may be implemented individually or in combination. By using a combination logic device (e.g., NAND gate 318), one or more voltage reductions may be detected in a relatively short time period (e.g., 2 clock cycles). Additionally, by using combinational logic, less power is consumed compared to the power draw by ADC 310.

In this embodiment, the output of NAND gate 318 may be provided to register group 320. In particular, the output (e.g., logic "1" if one or more of battery cells 300a-g experience a voltage reduction) may be provided to register 322 (labeled "Any Cell"). By storing data (that represents the output of NAND gate 318) in register 322, the data may be used by controller 338 for executing operations. For example, controller 338 may use the data to determine if a voltage reduction has been experienced by one or more of battery cells 300a-g. If a reduction has been experienced, controller 338 may, e.g., send a signal to discharge switch circuitry 202 for halting power delivery to the motor of drill 102.

Data may also be provided to register group 320 that represents the voltage present on each of resistors 316a-g. In this embodiment, each input (e.g., seven inputs) of NAND gate 318 may be connected to register group 320. Due to the connections, each individual input may be assigned one register included in register group 320. For example, the input connected to resistor 316a may be assigned to register 324 (labeled "Cell 1"). Correspondingly, inputs connected to resistors 316b-316g may be assigned to respective registers 326-336. Data may be entered into individual registers to represent if a voltage reduction may have occurred. For example, if voltage reduces at battery cell 300a, the voltage across resistor 316a may be relatively low (as provided via switch 314a not being biased closed). This reduced voltage across resistor 316a may represent logic "0" if the voltage may be below a predefined threshold. Accordingly, logic "0" may be entered into the register 324 to indicate the voltage reduction present at battery cell 300a. Alternatively, if an appropriate voltage is present at battery cell 300a, a voltage may be present across resistor 316a (as provided by switch 314a being biased closed). In this scenario, logic "1" may be entered into the register 322. Similar data may be entered into registers 326-336 to indicate the voltage present at respective battery cells 300b-g. Thus, switches 314a-g and resistors 316a-g provide the status of each battery cell 300a-g to register group 320 in a substantially passive manner and in a relative short period of time.

Controller 338 may access one or more of the registers in register group 320 to determine if a voltage reduction has occurred at one or more of battery cells 300a-g. Additionally, controller 338 may access one or more registers 322-336 to identify which of the one or more battery cells have a deficient voltage level. Controller 338 may be implemented as one or more general processors (e.g., a microprocessor) or by one or more specialized devices (e.g., an application specific integrated circuit (ASIC), etc.). Controller 338 and/or register group 320 may be implemented in a single integrated circuit as a monolithic structure. Similarly battery gauge circuitry 204 may be implemented as a single integrated circuit as a monolithic structure. Register group 320 may also reside in memory (e.g., random access memory (RAM), read-only memory (ROM), static RAM (SRAM), etc.).

To determine if one or more of battery cells 300a-g may have reached the minimum allowed voltage, controller 322 may execute a voltage monitor 340. Along with determining if a voltage reduction may have occurred, executing voltage monitor 340 may also identify the particular battery cell (or cells) that may have experienced a voltage reduction. The voltage monitor 340 may be implemented in digital electronic circuitry, or in computer hardware, firmware, software, or in combinations of them. Voltage monitor 340 may also be implemented as a computer program product, e.g., a computer program tangibly embodied in an information carrier, e.g., in a machine-readable storage device (e.g., RAM, ROM, hard-drive, CD-ROM, etc.) or in a propagated signal. The computer program product may be executed by or control the operation of, data processing apparatus, e.g., a programmable processor, a computer, or multiple computers. A computer program may be written in one or more forms of programming languages, including compiled or interpreted languages, and it can be deployed in any form, including as a stand-alone program or as a module, component, subroutine, or other unit suitable for use in a computing environment. A computer program may be deployed to be executed on one computing device (e.g., controller, computer system, etc.) or on multiple computing devices (e.g., multiple controllers) at one site or distributed across multiple sites and interconnected by a communication network.

Voltage monitor 340 may access the register 322 to determine if one or more of switches 314a-g may be open (not biased closed) and the corresponding one or more battery cells that may have experienced a voltage reduction. For example, voltage monitor 340 may access register 322 and read the stored information. Based on this information, voltage monitor 340 may relatively quickly determine if one or more of switches 314a-g may be open. For example, if logic "0" may be represented by data stored in the register 322, voltage monitor 340 may determine that at least one switch is open. Alternatively, logic "1" may be represented in the data stored in register 322. By accessing and reading the data, voltage monitor 340 may determine that none of switches 314a-g may be open.

By determining that at least one of battery cells 300a-g may have experienced a voltage reduction, controller 338 may initiate an appropriate action or actions. For example, controller 338 may initiate generating a control signal that may be provided to discharge switch circuitry 202. Upon receiving the control signal, discharge switch circuitry 202 may open the connection between battery cell module 200 and the motor of drill 102. By opening the connection, power delivery may be halted since one or more of battery cells 300a-g may be in a hazardous low voltage state. Increasing the monitoring rate of battery cells 300a-g may also be an appropriate action. For example, upon determining one or more of battery cells 300a-g may have a reduced voltage, controller 338 may request that ADC 310 and the computing system monitor battery cells 300a-g.

Voltage monitor 340 may also identify the one or more battery cells that may have experienced a voltage reduction. For example, voltage monitor 340 may access each of registers 324-336 after detecting a voltage reduction on at least one battery cell (via the contents of register 322). In this embodiment, if one or more of registers 324-336 store data that represents logic "0", the associated battery cell may have experienced a voltage reduction. Alternatively, if one (or more) of registers 324-336 store data that may represent a logic "1", the associated battery cell may be presently charged to an appropriate level. By identifying the one or more battery cells with a reduced voltage level, controller 338 may generate a signal to initiate an appropriate action or actions (e.g., initiate recharging of the identified battery cells).

Figure 4:
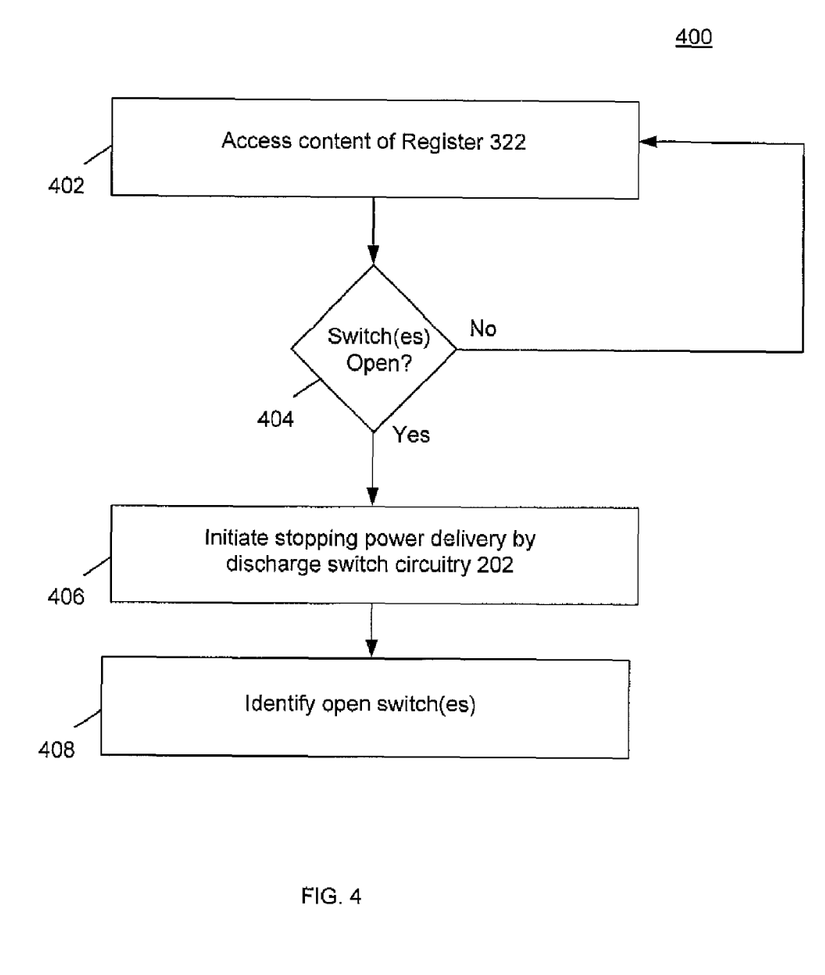
FIG. 4 is a flowchart that represents some of the operations of a controller included in the battery gauge shown in FIG. 2.

FIG. 4 presents a flowchart 400 that includes some of the operations of voltage monitor 340. For example, some operations may include accessing 402 register 322 to read the register content for determining if one or more of switches 314a-g may be open. An open switch may represent that a corresponding battery cell has experienced a voltage reduction. Operations may also include determining 404 if one or more of switches 300a-g may be open. For example, voltage monitor 340 may determine that register 322 may be storing data that represents logic "1". As provided by NAND gate 318, logic "1" may represent that one or more of switches 314a-g may be open. Alternatively, stored data may represent logic "0", and thereby represent that none of switches 314a-g may be open. If determined that none of switches 314a-g may be open, another operation may include returning to access 402 the content of register 322.

If determined that one or more of switches 314a-g may be open, other operations may include initiating 406 the stoppage of power delivery by discharge switch circuitry 202. Other operations may also include identifying 408 the open switches. By identifying the open switch (or switches), controller 338 may identify the respective battery cell (or battery cells) associated with the open switch (or switches). Once the battery cells have been identified, controller 338 may initiate one or more appropriate actions. For example, controller 338 may initiate recharging of the battery cells associated with the open switches.

One or more of the operations associated with flowchart 400 may be performed by one or more programmable processors (e.g., controller 338) executing a computer program to perform the operations by operating on input data (e.g., contents of register 322-336) and generating output (e.g., one or more control signals). The operations may also be performed by controller 338 implemented as special purpose logic circuitry (e.g., an FPGA (field programmable gate array), an ASIC (application-specific integrated circuit), etc.). In some arrangements one or more of the operations associated with flowchart 400 (along with other operations) may be dependent upon the type of power tool or portable device in which the battery cells are being monitored. For example, additional operations may be executed or operations may not be executed due to the portable device type.

In some embodiments controller 338 may be suitable for executing a computer program and may include, by way of example, general and/or special purpose microprocessors. In general, a processor may receive instructions and data from a memory (e.g., ROM, RAM, etc.). Controller 338 may be operatively coupled to receive data from or transfer data to, or both, one or more mass storage devices (e.g., magnetic, magneto-optical disks, or optical disks, etc.) for storing data. Information carriers suitable for embodying computer program instructions and data may include forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

As described above, power delivery may be stopped if a voltage reduction has occurred at one or more of the battery cells. In some arrangements the power delivery may be stopped due to other events. For example, power delivery may be stopped during a charging operation to reduce over charging effects.

A number of implementations have been described. Nevertheless, it will be understood that various modifications may be made. Accordingly, other implementations are within the scope of the following claims.

What is claimed is:

1. An apparatus, comprising:
a battery gauge circuitry implemented on an integrated circuit, said battery gauge circuitry comprising:
a plurality of switches each configured to receive a respective voltage signal representative of a voltage on an associated battery cell and configured to individually open in response to a voltage reduction on a battery cell associated with a respective one of said switches;
a logic device configured to determine if at least one of the switches is open;
at least one register configured to store data that indicates if at least one switch of said plurality of switches is open; and
a controller configured to initiate halting power delivery to a load if at least one of the switches is open.

2. The apparatus of claim 1, wherein said logic device is further configured to concurrently receive a plurality of voltages each associated with a respective one of said battery cells.

3. The apparatus of claim 1, further comprising a plurality of resistors each coupled to at least one of said plurality of switches and configured to receive said voltage on said associated battery cell.

4. The apparatus of claim 1, wherein the controller is further configured to initiate recharging of at least one of said battery cells.

5. The apparatus of claim 1, wherein said controller is further configured to identify said open switch.

6. The apparatus of claim 3, wherein said logic device includes a NAND gate coupled to said controller, and wherein at least one of said plurality of resistors is coupled to an input of said NAND gate, said NAND gate configured to receive said voltage reduction signal and initiate an interrupt signal in response to said voltage reduction signal, and wherein said controller is configured to receive said interrupt signal and initiate said halting power delivery to the load.

7. The apparatus of claim 1, wherein at least one of said switches includes a transistor.

8. The apparatus of claim 7, wherein at least one of said switches includes a field-effect transistor.

9. A battery pack, comprising:
a plurality of battery cells;
discharge switch circuitry configured to provide power from said battery cells to a load; and
a battery gauge circuitry implemented on an integrated circuit, said battery gauge circuitry comprising:
a plurality of switches each configured to receive a respective voltage signal representative of a voltage on an associated battery cell and configured to individually open in response to a voltage reduction on a battery cell associated with a respective one of said switches;
a logic device configured to determine if at least one of the switches is open;
at least one register configured to store data that indicates if at least one switch of said plurality of switches is open; and
a controller configured to initiate halting power delivery to a load if at least one of the switches is open.

10. The battery pack of claim 9, wherein said logic device is further configured to concurrently receive a plurality of voltages each associated with a respective one of said battery cells.

11. The battery pack of claim 9, further comprising a plurality of resistors each coupled to at least one of said plurality of switches and configured to receive said voltage on said associated battery cell.

12. The battery pack of claim 9, wherein the controller is further configured to initiate recharging of at least one of said battery cells.

13. The battery pack of claim 9, wherein said controller is further configured to identify said open switch.

14. The battery pack of claim 11, wherein said logic device includes a NAND gate coupled to said controller, and wherein at least one of said plurality of resistors is coupled to an input of said NAND gate, said NAND gate configured to receive said voltage reduction signal and initiate an interrupt signal in response to said voltage reduction signal, and wherein said controller is configured to receive said interrupt signal and initiate said halting power delivery to the load.

15. The battery pack of claim 9, wherein at least one of said switches includes a transistor.

16. The battery pack of claim 15, wherein at least one of said switches includes a field-effect transistor.

17. A system comprising:
a cordless power tool;
a battery pack comprising a plurality of battery cells configured to provide power to said cordless power tool; and
a battery gauge circuitry implemented on an integrated circuit, said battery gauge circuitry comprising:
   a plurality of switches each configured to receive a respective voltage signal representative of a voltage on an associated battery cell and configured to individually open in response to a voltage reduction on a battery cell associated with a respective one of said switches;
   a logic device configured to determine if at least one of the switches is open;
   at least one register configured to store data that indicates if at least one switch of said plurality of switches is open; and
   a controller configured to initiate halting power delivery to said cordless power tool if at least one of the switches is open.

18. The system of claim 17, wherein the cordless power tool comprises a drill.

19. The system of claim 17, wherein the controller is further configured to initiate recharging of at least one of said battery cells.

20. The system of claim 17, wherein said controller is further configured to identify said open switch.

* * * * *